(12) United States Patent
Guo et al.

(10) Patent No.: US 11,775,589 B2
(45) Date of Patent: Oct. 3, 2023

(54) SYSTEMS AND METHODS FOR WEIGHTED QUANTIZATION

(71) Applicant: Google LLC, Mountain View, CA (US)

(72) Inventors: Ruiqi Guo, Elmhurst, NY (US); David Simcha, Jersey City, NJ (US); Quan Geng, Jersey City, NJ (US); Felix Chern, New York, NY (US); Sanjiv Kumar, Jericho, NY (US); Xiang Wu, Berkeley, CA (US)

(73) Assignee: GOOGLE LLC, Mountain View, CA (US)

( * ) Notice: Subject to any disclaimer, the term of this patent is extended or adjusted under 35 U.S.C. 154(b) by 453 days.

(21) Appl. No.: 17/001,850

(22) Filed: Aug. 25, 2020

(65) Prior Publication Data

US 2021/0064634 A1 Mar. 4, 2021

Related U.S. Application Data

(60) Provisional application No. 62/891,667, filed on Aug. 26, 2019.

(51) Int. Cl.
*G06F 16/20* (2019.01)
*G06F 16/906* (2019.01)
(Continued)

(52) U.S. Cl.
CPC ...... *G06F 16/906* (2019.01); *G06F 16/24578* (2019.01); *G06F 16/258* (2019.01); *H03M 7/30* (2013.01)

(58) Field of Classification Search
CPC ... G06F 16/258; G06F 16/24578; H03M 7/30
See application file for complete search history.

(56) References Cited

U.S. PATENT DOCUMENTS

| 9,008,241 B1* | 4/2015 | Tong | H04L 25/00 |
| | | | 329/304 |
| 2002/0039450 A1* | 4/2002 | Kimoto | G06T 9/004 |
| | | | 382/239 |

(Continued)

FOREIGN PATENT DOCUMENTS

| JP | H06164415 A | * | 6/1994 |
| JP | 2004229100 A | * | 8/2004 |

OTHER PUBLICATIONS

Andoni et al., "Practical and Optimal LSH for Angular Distance", Advances in Neural Information Processing Systems, Dec. 8-13, 2014, Montreal, Canada, 9 pages.

(Continued)

*Primary Examiner* — Tarek Chbouki
(74) *Attorney, Agent, or Firm* — Dority & Manning, P.A.

(57) ABSTRACT

Generally, the present disclosure is directed to systems and methods of quantizing a database with respect to a novel loss or quantization error function which applies a weight to an error measurement of quantized elements respectively corresponding to the datapoints in the database. The weight is determined based on the magnitude of an inner product between the respective datapoints and a query compared therewith. In contrast to previous work, embodiments of the proposed loss function are responsive to the expected magnitude of an inner product between the respective datapoints and a query compared therewith and can prioritize error reduction for higher-ranked pairings of the query and the datapoints. Thus, the systems and methods of the present disclosure provide solutions to some of the problems with traditional quantization approaches, which regard all error as equally impactful.

20 Claims, 6 Drawing Sheets

(51) Int. Cl.
  *G06F 16/25* (2019.01)
  *H03M 7/30* (2006.01)
  *G06F 16/2457* (2019.01)

(56) References Cited

U.S. PATENT DOCUMENTS

| | | | | |
|---|---|---|---|---|
| 2002/0156766 | A1* | 10/2002 | Nakamura | H04L 12/2821 |
| 2002/0178158 | A1* | 11/2002 | Kanno | G06F 16/338 |
| | | | | 707/999.005 |
| 2009/0109490 | A1* | 4/2009 | Lau | H04N 1/4055 |
| | | | | 358/3.06 |
| 2018/0101570 | A1* | 4/2018 | Kumar | G06F 16/285 |
| 2019/0281267 | A1* | 9/2019 | Fuchie | H04N 5/77 |
| 2020/0134461 | A1* | 4/2020 | Chai | G06N 3/10 |

OTHER PUBLICATIONS

Andre et al., "Cache locality is not enough: High-Performance Nearest Neighbor Search with Product Quantization Fast Scan", Proceedings of the VLDB Endowment, vol. 9, No. 4, 2015, pp. 288-299.

Aumuller et al., "ANN-Benchmarks: A Benchmarking Tool for Approximate Nearest Neighbor Algorithms" Information Systems, vol. 87, No. 11, Feb. 2019, 14 pages.

Babenko et al., "Additive Quantization for Extreme Vector Compression", 2014 IEEE Conference on Computer Vision and Pattern Recognition (CVPR), Jun. 24-27, 2014, Columbus, Ohio, 8 pages.

Babenko et al., "The Inverted Multi-Index", Conference on Computer Vision and Pattern Recognition (CVPR), Jun. 16-21, 2012, Providence, Rhode Island, 8 pages.

Cremonesi et al., "Performance of Recommender Algorithms on Top-N Recommendation Tasks", Fourth ACM Conference on Recommender Systems, Sep. 26-30, 2010, Barcelona, Spain, 8 pages.

Dai et al., "Stochastic Generative Hashing", $34^{th}$ International Conference on Machine Learning, Aug. 6-11, 2017, Sydney, Australia, 10 pages.

Dasgupta et al., "Random projection trees and low dimensional manifolds", Fortieth Annual ACM Symposium on Theory of Computing, May 17-20, 2008, Victoria, British Columbia, Canada, 10 pages.

Dean et al., "Fast, Accurate Detection of 100,000 Object Classes on a Single Machine: Technical Supplement", IEEE Conference on Computer Vision and Pattern Recognition, Jun. 23-28, 2018, Portland, Oregon, 3 pages.

Ge et al., "Optimized Product Quantization", IEEE Transactions on Pattern Analysis and Machine Intelligence, vol. 36, No. 4, Apr. 2014, 12 pages.

Gong et al., "Iterative Quantization: A Procrustean Approach to Learning Binary Codes for Large-scale Image Retrieval", IEEE Transactions on Pattern Analysis and Machine Intelligence, vol. 35, No. 12, Dec. 2013, 15 pages.

Guo et al., "Quantization based Fast Inner Product Search", $19^{th}$ International Conference on Artificial Intelligence and Statistics (AISTATS), May 7-11, 2016, Cadiz, Spain, pp. 482-490.

Harwood et al., "FANNG: Fast Approximate Nearest Neighbour Graphs", 2016 IEEE Conference on Computer Vision and Pattern Recognition (CVPR), Jun. 26-Jul. 1, 2016, Las Vegas, Nevada, pp. 5713-5722.

He et al., "K-means Hashing: an Affinity-Preserving Quantization Method for Learning Binary Compact Codes", IEEE Conference on Computer Vision and Pattern Recognition, Jun. 23-28, 2013, Portland, Oregon, pp. 2938-2945.

Indyk et al., "Approximate Nearest Neighbors: Towards Removing the Curse of Dimensionality", Thirtieth Annual ACM Symposium on Theory of Computing (STOC), May 23-26, 1998, Dallas TX, pp. 604-613.

Jegou et al., "Product Quantization for Nearest Neighbor Search", IEEE Transactions on Pattern Analysis and Machine Intelligence, vol. 33, No. 1, 2011, 14 pages.

Johnson et al., "Billion-scale similarity search with GPUs", arXiv: 1702.08734v1, Feb. 28, 2017, 12 pages.

Liong et al., "Deep Hashine for Compact Binary Codes Learning", IEEE Conference on Computer Vision and Pattern Recognition (CVPR), Jun. 7-12, 2015, Boston, Massachusetts, pp. 2475-2483.

Malkov et al., "Efficient and robust approximate nearest neighbor search using Hierarchical Navigable Small World graphs", arXiv:1603. 09320v2, May 21, 2016, 21 pages.

Martinez et al., "Revisiting Additive Quantization", European Conference on Computer Vision, Oct. 8-16, Amsterdam, The Netherlands, pp. 137-153.

Matsui et al., "PQTable: Fast Exact Asymmetric Distance Neighbor Search for Product Quantization using Hash Tables", IEEE International Conference on Computer Vision, Dec. 11-18, 2015, Chile, Santiago, pp. 1940-1948.

Muja et al., "Scalable Nearest Neighbor Algorithms for High Dimensional Data", IEEE Transactions on Pattern Analysis and Machine Intelligence, vol. 36, No. 11, Nov. 2014, pp. 2227-2240.

Mussmann et al., "Learning and Inference via Maximum Inner Product Search", $33^{rd}$ International Conference on Machine Learning, Jun. 19-24, 2016, New York, New York, 10 pages.

Norouzi et al., "Cartesian k-means", IEEE Conference on Computer Vision and Pattern Recognition, Jun. 23-28, 2013, Portland, Oregon, 8 pages.

Norouzi et al., "Fast Exact Search in Hamming Space with Multi-Index Hashing", IEEE Transaction on Pattern Analysis and Machine Intelligence, vol. 36, No. 6, Jun. 2014, 14 pages.

Nurvitadhi et al., "Accelerating Binarized Neural Networks: Comparison of FPGA, CPU, GUP, and ASIC", 2016 International Conference on Field-Programmable Technology (FPT), Dec. 7-9, 2016, Xi'an China, 8 pages.

Pennington et al., "GloVe: Global Vectors for Word Representation", Empirical Methods in Natural Language Processing (EMNLP), Oct. 25-29, 2014, Doha, Qatar, pp. 1532-1543.

Pritzel et al., "Neural Episodic Control", $34^{th}$ International Conference on Machine Learning, Aug. 6-11, 2017, Sydney, Australia, 10 pages.

Shrivastava et al., Asymmetric LSH (ALSH) for Sublinear Time Maximum Inner Product Search (MIPS), Advances in Neural Information Processing Systems, Dec. 8-13, 2014, Montreal, Canada, 9 pages.

Wang et al., "Hashing for Similarity Search: A Survey", arXiv:1408. 2927v1, Aug. 13, 2014, 29 pages.

Wang et al., "Learning to Hash for Indexing Big Data—A Survey", Proceedings of the IEEE, vol. 104, No. 1, Jan. 2016, pp. 34-57.

Wu et al., "Multiscale Quantization for Fast Similarity Search", Advances in Neural Information Processing Systems, Dec. 4-9, 2017, Long Beach, CA, 11 pages.

Yen et al., "Loss Decomposition for Fast Learning in Large Output Spaces", $35^{th}$ International Conference on Machine Learning, Jul. 10-15, 2018, Stockholm, Sweden, 10 pages.

Zhang et al., "Composite Quantization for Approximate Nearest Neighbor Search", International Conference on Machine Learning, Jun. 21-26, 2014, Beijing, China, 9 pages.

Zhu et al., "Trained Ternary Quantization", arXiv:1612.01064v3, Feb. 23, 2017, 10 pages.

* cited by examiner

SYSTEMS AND METHODS FOR WEIGHTED QUANTIZATION

RELATED APPLICATIONS

This application claims priority to and the benefit of U.S. Provisional Patent Application No. 62/891,667, filed Aug. 26, 2019, which is hereby incorporated herein by reference in its entirety.

FIELD

The present disclosure relates generally to the quantization of a set of datapoints. More particularly, the present disclosure relates to the quantization of a set of datapoints to improve the approximation of an inner product with the datapoints.

BACKGROUND

Maximum inner product search (MIPS) has become a popular paradigm for solving large scale classification and retrieval tasks. For example, user queries and potential results to such queries (e.g., documents such as webpages, items of content such as products, images, or the like, words in a vocabulary, etc.) are embedded into dense vector space of the same dimensionality and MIPS is used to find the most relevant results given a user query. Similarly, in extreme classification tasks, MIPS is used to predict the class label when a large number of classes, often on the order of millions or even billions are involved. Lately, MIPS has also been applied to training tasks such as scalable gradient computation in large output spaces, efficient sampling for speeding up softmax computation and sparse updates in end-to-end trainable memory systems.

One goal of MIPS is to find a datapoint in a given database that has the highest inner product with a query point. Exhaustively computing the exact inner product between the query and all the datapoints in the database is often very expensive and sometimes infeasible. Thus, the inner products between the query and the database datapoints is sometimes approximated using quantization techniques. In general, quantization techniques determine quantized datapoints so that a quantized value or a combination of quantized values may satisfactorily represent one or more of the original datapoints. In this manner, the quantization technique generates a representation of the original dataset using a smaller number of datapoints (i.e., the quantized datapoints) than the number of datapoints in the original dataset.

In most traditional quantization approaches, the objective in the quantization procedure is to minimize the reconstruction error for the datapoints to be searched, e.g., the difference between a datapoint and its quantized value. However, the traditional objective function is evaluated equally with respect to all possible query-datapoint combinations, and not all query-datapoint pairs are equally important for the approximation of the maximum inner product. Thus, there exists a need for a quantization method which tailors the objective to improve the inner product approximation in, e.g., MIPS procedures.

SUMMARY

Aspects and advantages of embodiments of the present disclosure will be set forth in part in the following description, or can be learned from the description, or can be learned through practice of the embodiments.

One example aspect of the present disclosure is directed to a computer-implemented method of quantizing a dataset. The method includes obtaining, by one or more computing devices, a dataset containing a plurality of data elements, and determining, by the one or more computing devices, a quantized dataset containing a plurality of quantized elements that respectively correspond to the plurality of data elements. In one embodiment, each of the plurality of quantized elements has a respective quantization error, and the respective quantization error for each quantized element is weighted by a respective weight value having a weight magnitude that is positively correlated with a magnitude of an inner product between the corresponding data element for such quantized element and a query.

Another example aspect of the present disclosure is directed to a computing system comprising one or more processors and one or more non-transitory computer-readable media that collectively store a quantized dataset and instructions. The quantized dataset comprises a plurality of quantized elements that respectively correspond to a plurality of data elements. The plurality of quantized elements were selected based at least in part on a loss function that comprises a sum of respective quantization errors respectively associated with the plurality of quantized elements. The respective quantization error for each quantized element is weighted by a respective weight value having a weight magnitude that is positively correlated with a magnitude of an inner product between the corresponding data element and a query. The instructions, when executed by the one or more processors, cause the computing system to perform operations. The operations comprise obtaining, by the one or more computing devices, a new query, and determining, by the one or more computing devices, a respective inner product between the new query and at least some of the plurality of quantized elements to identify one or more of the data elements that are relevant to the new query.

Another example aspect of the present disclosure is directed to a computing system comprising one or more processors and one or more non-transitory computer-readable media that collectively store instructions that, when executed by one or more computing devices, cause the one or more computing devices to perform operations. The operations comprise obtaining a dataset containing a plurality of data elements. The operations also comprise determining a quantized dataset containing a plurality of quantized elements that respectively correspond to the plurality of data elements, each of the plurality of quantized elements corresponding to a quantization error. The operations also comprise minimizing the sum of the quantization error for each of the plurality of quantized data elements. The quantization error is positively correlated to an expected value of a weighted difference between a true inner product and an approximate inner product. The true inner product is an inner product between a query and one of the plurality of data elements, and the approximate inner product is an inner product between the query and one of the plurality of quantized elements respectively corresponding to the one of the plurality of data elements. The weighted difference is provided a weight positively correlated to the magnitude of the true inner product.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

Figure 1A:
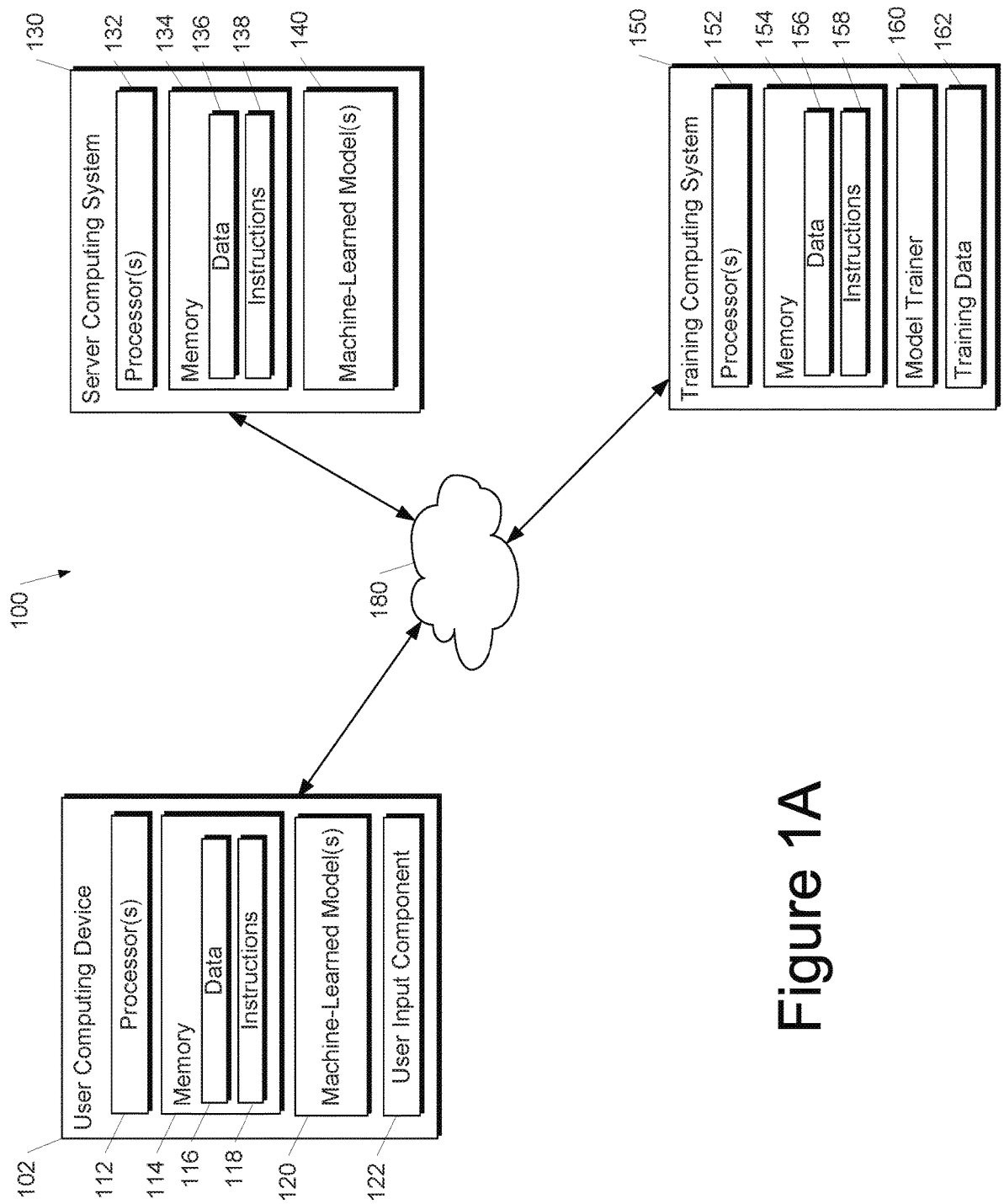
FIG. 1A depicts a block diagram of an example computing system according to example embodiments of the present disclosure.

Reference numerals that are repeated across plural figures are intended to identify the same features in various implementations.

DETAILED DESCRIPTION

Overview

Generally, the present disclosure is directed to systems and methods of quantizing a database with respect to a novel loss or quantization error function. In particular, one aspect of the present disclosure is directed to a loss function which applies a respective weight to a respective error measurement of each quantized element that corresponds to one of the datapoints in the database. The respective weight for each quantized element can be determined based on the magnitude of an inner product between the corresponding datapoint and a query compared therewith. Thus, one aspect of the present disclosure is directed to a quantization loss function that weights the error term for each quantized element based on the value of the inner product, giving more importance to pairs of queries and datapoints whose inner products are high. Such weighting leads to an effective and intuitive loss function which can be use with a wide class of quantization algorithms, including, as examples, binary quantization and product quantization. The present disclosure also provides example algorithms for learning the codebook, as well as quantizing new datapoints, using the new loss functions. Example experimental results contained in the U.S. Provisional Patent Application No. 62/891,667 demonstrate that the objective functions described herein yield significant gain on the approximation of true inner product, as well as the retrieval performance.

In one aspect, the present disclosure is directed to methods and systems for quantizing a dataset and/or performing MIPS between a search query and a dataset quantized as described herein. In some examples, the quantization error function proposed herein improves the accuracy of an estimated MIPS in which the inner product results to be searched are estimated by comparing the search query to the quantized dataset. The quantization error function has performed very well in experiments, as illustrated by example experimental data included in U.S. Provisional Patent Application No. 62/891,667, which is fully incorporated into and forms a portion of this disclosure.

In contrast to previous work, embodiments of the proposed loss function are responsive to the expected magnitude of an inner product between the respective datapoints and a query compared therewith. In some examples, the actual or true inner product is approximated by an inner product between the search query and the quantized element respectively corresponding to the datapoint. When the object of the search is to find the datapoint which would provide the largest inner product with a search query, the loss function proposed herein may prioritize the minimization of the error of the approximate inner products involving the quantized elements which are expected to generate the largest values of an inner product with a query. Thus, the systems and methods of the present disclosure provide solutions to some of the problems with traditional quantization approaches, which regard all error as equally impactful.

As the experimental data shows, weighting the quantization error as disclosed herein may decrease the magnitude of the relative estimation error (e.g., wherein the difference between the estimated value and the actual value is divided by the actual value) of top-ranking pairs between a search query and a dataset across a wide range of bitrates used in the estimation procedure. Additionally, weighting the quantization error as disclosed herein is shown to increase the recall performance of MIPS algorithms (e.g., the algorithms return a larger proportion of true top-ranked pairs—ground truth results—within a list of predicted top-ranked pairs).

The systems and methods of the present disclosure provide a number of technical effects and benefits. As one example, the techniques described herein enable quantization of a dataset according to a loss function that improves, relative to use of traditional loss functions, the ability of a machine-learned model to perform a task (e.g., an image processing, computer vision task, sensor data processing task, audio processing task, text processing task, classification task, detection task, recognition task, data search task, etc.). Thus, the systems and methods of the present disclosure can improve the ability of a computing system that includes the machine-learned model to perform various practical applications, thereby improving the functioning of such a computing system.

As another example technical effect and benefit, the techniques described herein enable the selection of a loss function in a much more efficient fashion than existing techniques, such as, for example, black box optimization techniques. In particular, the techniques described herein provide for an analytically computable weight value, avoiding costly iterations of the quantization procedure to determine a weight value. Reducing the number of quantization iterations that are required to be performed in order to optimize the quantization performance conserves computing resources such as reducing the amount of processor usage, memory usage, network bandwidth usage, and/or the like, thereby improving the functioning and resource consumption of the computing system itself.

Likewise, the above-noted accuracy improvement and increase in recall performance provide for improvements in the ability of computing devices and systems to perform a desired task with greater speed and efficiency. For instance, a computing device which can estimate MIPS results with greater precision and/or recall while using a lower bitrate can perform tasks such as retrieving data from locations in memory at a lower expense of computing resources. The accuracy of the estimations at lower bitrates may also enable, in some embodiments, more compact storage and/or efficient transmission of estimated data and/or results as compared to existing methods and systems. Furthermore, improvements in accuracy and recall performance may also permit a user of a computing device or system as disclosed herein to accomplish a particular task with fewer repetitions, lower wait times, and an improved user experience.

Example implementations of the techniques described herein will now be discussed in greater detail.

Example Notation and Problem Statement

Aspects of the present disclosure consider a general quantization problem in which there exists a database $X=\{x_i\}_{i=1,2,\ldots,N}$ with N datapoints or data elements, where each datapoint $x_i \in \mathbb{R}^d$ exists in a d-dimensional vector space. In general, it may be desired to approximate a calculation involving the database X by performing the calculation with a smaller set of values which represent the datapoints or data elements of database X. The smaller set of values may include a set of quantized datapoints $\tilde{x}_i \in \mathbb{R}^d$, where for every i the quantized datapoint corresponds to, in some examples, a codebook value $c_j$ (or a combination/concatenation thereof) identified by the index $j=1, 2, \ldots, k$.

In one example, it may be desired to compare a query $q \in \mathbb{R}^d$ with the database X, e.g., with the calculation of the inner product $\langle q, x_i \rangle$ for $i \in \{1, 2, \ldots, N\}$. The set of quantized points may thus be used to estimate the inner product, i.e., $\langle q, \tilde{x}_i \rangle$. As used herein, t represents the value of the true inner product between the query and the datapoints in the database X, $\langle q, x_i \rangle$.

Failure of Existing Quantization Techniques

Common quantization techniques focus on minimizing the reconstruction error (sum of squared error) when $x_i$ is quantized to $\tilde{x}_i$, expressed as $$\sum_{i=1}^{N} \|x_i - \tilde{x}_i\|^2. \tag{1}$$

It can be shown that minimizing the reconstruction errors is equivalent to minimizing the expected error of the inner product between a query q and the quantized datapoints $\tilde{x}_i$ as compared to the inner product between q and the original datapoints $x_i$ under a mild condition on the query distribution. For instance, consider the quantization objective of minimizing the expected total inner product quantization errors over the query distribution:

$$\mathbb{E}_q \left[ \sum_{i=1}^{N} \|\langle q, x_i \rangle - \langle q, \tilde{x}_i \rangle\|^2 \right] = \mathbb{E}_q \left[ \sum_{i=1}^{N} \|q, x_i - \tilde{x}_i\|^2 \right]. \tag{2}$$

Under the assumption that q is isotropic, i.e., $\mathbb{E}[qq^T]=bI$, where I is the identity matrix and $b \in \mathbb{R}^+$, the objective function becomes $$\sum_{i=1}^{N} \mathbb{E}_q[\|q, x_i - \tilde{x}_i\|^2] = \sum_{i=1}^{N} \mathbb{E}_q[(x_i - \tilde{x}_i)^T qq^T (x_i - \tilde{x}_i)] = b \sum_{i=1}^{N} \|x_i - \tilde{x}_i\|^2. \tag{3}$$

Therefore, the objective becomes minimizing the reconstruction errors of the database points, which has been considered extensively in the literature.

The objective function of Equation (3) takes expectation equally over all possible combinations of datapoints $x_i$ and queries q. However, not all pairs of (x,q) are equally important. For instance, the approximation error on the pairs which have a high inner product is far more important in the case of MIPS since they are likely to be among the top ranked pairs and can greatly affect the search result, while for the pairs whose inner product is low the approximation error matters much less. Thus, for a given datapoint $x_i$, existing techniques fail to quantize the database X to prioritize accurate estimation of the higher-valued inner products between a query and the data elements.

Thus, more generally, it may be said that the failure of existing quantization techniques is attributable to the inability of existing quantization techniques to quantize the database X with sensitivity to the relative influence of quantization errors on downstream calculations and comparisons.

Example Weighted Quantization Procedure

A new objective or loss function is proposed herein which weights the approximation error of the inner product based on the value of the true inner product.

For example, let a weighting function $w(t) \geq 0$ be a monotonically non-decreasing function, and consider the following inner-product weighted quantization error:

$$\sum_{i=1}^{N} \mathbb{E}_q[w(\langle q, x_i \rangle)\langle q, x_i - \tilde{x}_i \rangle^2] = \sum_{i=1}^{N} \int w(t) \mathbb{E}_q[\langle q, x_i - \tilde{x}_i \rangle^2 \mid \langle q, x_i \rangle = t] dP(\langle q, x_i \rangle \leq t). \tag{4}$$

In some embodiments, the weighting function may be a step function defined as $w(t)=I(t \geq T)$, which disregards the error contribution of all $\tilde{x}_i$ whose corresponding true inner product t is less than a certain threshold T. Generally, the weighting function is positively correlated to the magnitude of t (e.g., having a positive Spearman's correlation coefficient). In some examples, the weighting function monotonically increases in t. For instance, a weighting function may include one or more decay, ramp, and/or other functions (e.g., exponential, power, logarithmic, and polynomial) to provide an increase from a first weight value to a second weight value as the value of t approaches T. After the value of t meets or exceeds T, the weight value may further increase and approach a third weight value.

In some embodiments, the inner-product weighted quantization errors may be decomposed based on the direction of the datapoints. Formally, let the quantization residual function be defined as $$r(x,\tilde{x}):=x-\tilde{x}. \tag{5}$$

Given the datapoint x and its quantizer $\tilde{x}$, the residual error may be decomposed into two parts, one parallel to x, $r_\parallel$, and one orthogonal to x, $r_\perp$:

$$r(x, \tilde{x}) = r_{\|}(x, \tilde{x}) + r_{\perp}(x, \tilde{x}) \qquad (6)$$

where $$r_{\|}(x, \tilde{x}) := \langle x - \tilde{x}, x \rangle \cdot \frac{x}{\|x\|} \qquad (7)$$

and $$r_{\perp}(x, \tilde{x}) := (x - \tilde{x}) - r_{\|}(x, \tilde{x}) \qquad (8)$$

In some examples, the norm of q does not affect the ranking result, so without loss of generality, the query is assumed to satisfy $\|q\|=1$ to simplify the derivation below. Additionally, q may generally be assumed to follow any distribution desired for calculation of the expected values of the inner products.

Theorem 3.1 Assuming the query q is uniformly distributed in d-dimensional unit sphere, and given the datapoint x and its quantizer $\tilde{x}$, conditioned on the inner product $\langle q, x \rangle = t$ for some $t>0$, $$\mathbb{E}_q[\langle q, x - \tilde{x}\rangle^2 \mid \langle q, x\rangle = t] = \frac{t^2}{\|x\|^2}\|r_{\|}(x, \tilde{x})\|^2 + \frac{1 - \frac{t^2}{\|x\|^2}}{d-1}\|r_{\perp}(x, \tilde{x})\|^2.$$

Proof. First, we can decompose $$q := q_{\|} + q_{\perp} \qquad (9)$$

into $$q_{\|} := \langle q, x \rangle \cdot \frac{x}{\|x\|} \qquad (10)$$

and $$q_{\perp} := q - q_{\|} \qquad (11)$$

where $q_{\|}$ is parallel to x and $q_{\perp}$ is orthogonal to x, such that $$\mathbb{E}_q[\langle q, x - \tilde{x}\rangle^2 \mid \langle q, x\rangle = t] = \qquad (12)$$
$$\mathbb{E}_q[\langle q_{\|} + q_{\perp}, r_{\|}(x, \tilde{x}) + r_{\perp}(x, \tilde{x})\rangle^2 \mid \langle q, x\rangle = t] =$$
$$\mathbb{E}_q[(\langle q_{\|}, r_{\|}(x, \tilde{x})\rangle + \langle q_{\perp}, r_{\perp}(x, \tilde{x})\rangle)^2 \mid \langle q, x\rangle = t]$$

which may be expanded to $$\mathbb{E}_q[\langle q, x-\tilde{x}\rangle^2 \mid \langle q,x\rangle = t] \mathbb{E}_q[q_{\|}, r_{\|}(x,\tilde{x})\rangle^2 \mid \langle q,x\rangle = t] +$$
$$\mathbb{E}[q_{\perp}r_{\perp}\langle x,\tilde{x}\rangle^2 \mid \langle q,x\rangle = t]. \qquad (13)$$

The last step uses the fact that $$\mathbb{E}_q[\langle q_{\|}, r_{\|}(x,\tilde{x})\rangle \langle q_{\perp}, r_{\perp}(x,\tilde{x})\rangle \mid \langle q,x\rangle = t] = 0$$

due to symmetry. The first term of Equation (13) may be further simplified:

$$\mathbb{E}_q[\langle q_{\|}, r_{\|}(x, \tilde{x})\rangle^2 \mid \langle q, x\rangle = t] = \qquad (14)$$
$$\|r_{\|}(x, \tilde{x})\|^2 \mathbb{E}_q[\|q_{\|}\|^2 \mid \langle q, x\rangle = t] = \frac{\|r_{\|}(x, \tilde{x})\|^2 t^2}{\|x\|^2}$$

Since $q_{\perp}$ is uniformly distributed in the (d−1) dimensional subspace orthogonal to x with the norm $$\sqrt{1 - \frac{t^2}{\|x\|^2}},$$

the second term of Equation (13) may be simplified as $$\mathbb{E}_q[\langle q_{\perp}, r_{\perp}(x, \tilde{x})\rangle^2 \mid \langle q, x\rangle = t] = \frac{1 - \frac{t^2}{\|x\|^2}}{d-1}\|r_{\perp}(x, \tilde{x})\|^2. \qquad (15)$$

Therefore, substituting the Equations (14) and (15) into (13), $$\mathbb{E}_q[\langle q, x - \tilde{x}\rangle^2 \mid \langle q, x\rangle = t] = \frac{t^2}{\|x\|^2}\|r_{\|}(x, \tilde{x})\|^2 + \frac{1 - \frac{t^2}{\|x\|^2}}{d-1}\|r_{\perp}(x, \tilde{x})\|^2. \qquad (16)$$

In the common scenario of x being unit-normed, i.e., $\|x\|^2 = 1$, Equation (16) simplifies to $$\mathbb{E}_q[\langle q, x - \tilde{x}\rangle^2 \mid \langle q, x\rangle = t] = t^2 \|r_{\|}(x, \tilde{x})\|^2 + \frac{1 - t^2}{d-1}\|r_{\perp}(x, \tilde{x})\|^2. \qquad (17)$$

Any reasonable w(t) may be used in the calculation of the weighted quantization error of Equation (4). In some embodiments, the weighting function may include a step function which compares the inner product magnitude t to a threshold T and discards from the calculation of the quantization error any contribution from values of $\tilde{x}_i$ for which the corresponding value of the inner product $\langle q, x_i \rangle$ is not expected to equal or exceed the threshold T. In this manner, some embodiments of the present disclosure may focus on the error reduction of values of $\tilde{x}_i$ for which the corresponding value of the inner product $\langle q, x_i \rangle$ is expected to equal or exceed the threshold T.

In one example, the inner-product weighted quantization error of Equation (4) may be computed for the case when w(t)=I(t≥T). Without loss of generality, q and x are assumed to be unit-normed for simplicity.

Proposition 1. Assuming the query q is uniformly distributed in the (d−1)-dimensional unit sphere with $\|q\|=1$ and all datapoints $x_i$ are unit-nonmed, given T>0, $$\sum_{i=1}^{N} \mathbb{E}_q[I(\langle q, x_i\rangle \geq T)\langle q, x_i - \tilde{x}_i\rangle^2] \propto$$
$$(d-1)\lambda(T)\sum_{i=1}^{N} \|r_{\|}(x, \tilde{x})\|^2 + \sum_{i=1}^{N} \|r_{\perp}(x, \tilde{x})\|^2$$

where $$\lambda(T) := \frac{\int_{t=T}^{1} t^2 dP(\langle q, x\rangle \leq t)}{\int_{t=T}^{1} (1 - t^2) dP(\langle q, x\rangle \leq t)}.$$

The parameter $\lambda(T)$ can be analytically computed, and $$\lambda(T) \to \frac{T^2}{1-T^2}$$

as the dimension $d \to \infty$.

Theorem 3.2.

$$\lambda(T) = \frac{\int_0^{\arccos(T)} \sin^{d-2}\theta \, d\theta}{\int_0^{\arccos(T)} \sin^d \theta \, d\theta} - 1. \tag{18}$$

Proof. Let $\theta := \arccos(t)$ and $\alpha := \arccos(T)$. Note that the term $$\frac{dP(\langle q, x \rangle \le t)}{dt}$$

is proportional to the surface area of $(d-1)$-dimensional hypersphere with a radius of sin 0:

$$\frac{dP(\langle q, x \rangle = t)}{dt} \propto S_{d-1} \sin^{d-2}\theta$$

where $S_{d-1}$ is the surface area of a $(d-1)$-sphere with unit radius.

Therefore, $\lambda(T)$ can be re-written as:

$$\lambda(T) = \frac{\int_0^\alpha \cos^2\theta S_{d-1} \sin^{d-2}\theta \, d\theta}{\int_0^\alpha \sin^2\theta S_{d-1} \sin^{d-2}\theta \, d\theta} \tag{19}$$

$$= \frac{\int_0^\alpha \sin^{d-2}\theta \, d\theta}{\int_0^\alpha \sin^d \theta \, d\theta} - 1.$$

Furthermore, let $$I_d = \int_0^\alpha \sin^d \theta \, d\theta, \tag{20}$$

giving $$I_d = -\cos\alpha \sin^{d-1}\alpha + \int_0^\alpha \cos^2\theta (d-1)\sin^{d-2}\theta \, d\theta \tag{21}$$

$$= -\cos\alpha \sin^{d-1}\alpha + (d-1)\int_0^\alpha \sin^{d-2}\theta \, d\theta - (d-1)\int_0^\alpha \sin^d \theta \, d\theta$$

$$= -\cos\alpha \sin^{d-1}\alpha + (d-1)I_{d-2} - (d-1)I_d.$$

Therefore, $I_d$ may be computed with the following recursive formula when d is a positive integer:

$$I_d = \frac{-\cos\alpha \sin^{d-1}\alpha}{d} + \frac{d-1}{d} I_{d-2}. \tag{22}$$

The parameter $\lambda(T)$ can thus be re-written as $$\lambda(T) = \frac{I_{d-2}}{I_d} - 1. \tag{23}$$

With a base case of $I_0 = \alpha$, and $I_1 = 1 - \cos\alpha$, the exact value of $\lambda(T)$ can be computed explicitly in $O(d)$ time. Additionally, it may be shown that the limit of $\lambda(T)$ exists and that it approaches $$\frac{T^2}{1-T^2} \text{ as } d \to \infty.$$

Thus, when $T \ge 0$, $$\lim_{d \to \infty} \lambda(T) = \frac{T^2}{1-T^2}. \tag{24}$$

Given a quantization scheme (e.g., vector quantization, product quantization, additive quantization), the weighted quantization error of Equation (4) may, in some embodiments, be expressed as $$\mu \sum_{i=1}^N \|r_\|(x, \tilde{x})\|^2 + \sum_{i=1}^N \|r_\perp(x, \tilde{x})\|^2 \tag{25}$$

where $\mu$ is a hyperparameter depending on the datapoint dimension d and the threshold T imposed on the inner product between queries and datapoints:

$$\mu := (d-1)\lambda(T). \tag{26}$$

Note that when the hyperparameter $\mu$ is set to be 1, Equation (25) is reduced to the traditional reconstruction errors of the datapoints.

As applied to vector quantization, in some embodiments, the objective for determining the quantized datapoints is as follows:

$$\min_{\substack{c_1, c_2, \ldots, c_k \in \mathbb{R}^d \\ \tilde{x}_i \in \{c_1, c_2, \ldots, c_k\}}} \left[ \sum_{i=1}^N (\mu \|r_\|(x_i, \tilde{x}_i)\|^2 + \|r_\perp(x_i, \tilde{x}_i)\|^2) \right]. \tag{27}$$

The objective may be resolved through a k-Means style Lloyd's algorithm, which iteratively minimizes the new loss functions by assigning datapoints to partitions and updating the partition quantizer in each iteration. The assignment step is computed by enumerating each quantizer and finding the quantizer that minimizes the objective. The update step finds the new quantizer $\tilde{x}^* \in \mathbb{R}^d$ for a partition of datapoints $\{x_{p_1}, x_{p_2}, \ldots, x_{p_m}\}$ where $p \in \{1, 2, \ldots, N\}$ is the index of the datapoint within the database X and $m \in \{1, 2, \ldots, N\}$ is the number of datapoints in the partition, wherein the quantizer is defined as $$\tilde{x}^* = \min_{\tilde{x} \in \mathbb{R}^d} \left[ \sum_{i=1}^m (\mu \|r_\|(x_i, \tilde{x}_i)\|^2 + \|r_\perp(x_i, \tilde{x}_i)\|^2) \right] \tag{28}$$

for each partition.

Because of the changed objective, the best quantizer in some implementations is not necessarily the center of the partition. Since Equation (28) is a convex function of x̃, there exists an optimal solution for Equation (28). The update rule given a fixed partitioning can be found by setting the partial derivative of Equation (28) with respect to each codebook entry to zero. This algorithm provably converges in a finite number of steps. Note that, in the special case that μ=1, the algorithm reduces to regular k-Means algorithm. The optimal solution of Equation (28) is $$\tilde{x}^* := \mu\left(1 + \frac{\mu-1}{m}\sum_{i=1}^{m}\frac{x_i x_i^T}{\|x_i\|^2}\right)^{-1}\frac{\sum_{i=1}^{m} x_i}{m} \quad (29)$$

The k-Means style Lloyd's algorithm converges in finite number of steps, which follows from the fact that the loss defined in Equation (27) is always non-increasing during both assignment and averaging steps under the changed objective.

In another example, the proposed objective function may be applied to product quantization. In product quantization, the original vector space $\in \mathbb{R}^d$ is decomposed as the Cartesian product of m distinct subspaces of dimension $$\frac{d}{m},$$

vector quantization algorithm is applied in each subspace separately (random rotation or permutation of the original vectors can be done before doing the Cartesian product). For example, let $x \in \mathbb{R}^d$ be written as $$x = (x^{(1)}, x^{(2)}, \ldots, x^{(m)}) \in \mathbb{R}^d,$$

where $x^{(j)} \in \mathbb{R}^{d/m}$ is denoted as the sub-vector for the j-th subspace. Each of the sub-vectors $x^{(j)}$ may be quantized to $\tilde{x}^{(j)}$ with its vector quantizer in subspace j, for $1 \leq j \leq m$. With product quantization, x is quantized as $(\tilde{x}^{(1)}, \ldots, \tilde{x}^{(m)}) \in \mathbb{R}^d$ and can be represented compactly using the assigned codes.

Using the proposed loss objective of Equation (25), the following loss function is minimized instead of the traditional objective of reconstruction error:

$$\min_{\substack{C_1, C_2, \ldots, C_m, \\ A \in \{1,2,\ldots,k\}^{N \times m}}} \left[\sum_{i=1}^{N}\left(\mu\|r_\|(x_i, \tilde{x}_i)\|^2 + \|r_\perp(x_i, \tilde{x}_i)\|^2\right)\right], \quad (30)$$

where $\tilde{x}_i$ denotes the product quantization of $x_i$, i.e., $$\tilde{x}_i := (C_{1,A_{i,1}}, C_{2,A_{i,2}}, \ldots, C_{m,A_{i,m}}). \quad (31)$$

To optimize Equation (30), the vector quantization of Equation (27) may be applied over all subspaces, except that the subspace assignment is chosen to minimize the global objective over all subspaces, instead of using the objective in each subspace independently. Similarly, the update rule is found by setting the derivative of loss in (30) with respect to each codebook entry to zero.

Another family of quantization function is binary quantization. In such a setting, a function h(x) is learned to quantize datapoints into binary codes, which saves storage space and can speed up distance computation. There are many possible ways to design such a binary quantization function. Some examples explicitly minimize reconstruction loss. For instance, a binary auto-encoder may be learned to quantize and dequantize binary codes:

$$\tilde{x} = g(h(x)), h(x) \in \{0,1\}^h \quad (32)$$

where h(·) is the "encoder" part which binarizes original datapoint into binary space and g(·) is the "decoder" part which reconstructs the datapoints given the binary codes. In one example, $h(x) = \text{sign}(W_h^T x + b_h)$ is the encoder function and $g(h) = W_g^T h$ is the decoder function, respectively. In another example, the encoder and/or decoder can be neural networks. The learning objective given in Equation (25) may be used to learn optimal parameters values of the encoder and decoder. For example, the learning objective given in Equation (25) can be backpropagated through the encoder and/or decoder and/or other update techniques can be used.

Example Devices and Systems

FIG. 1A depicts a block diagram of an example computing system 100 that may quantize a database according to example embodiments of the present disclosure. The system 100 includes a user computing device 102, a server computing system 130, and a training computing system 150 that are communicatively coupled over a network 180. The user computing device 102 can be any type of computing device, such as, for example, a personal computing device (e.g., laptop or desktop), a mobile computing device (e.g., smartphone or tablet), a gaming console or controller, a wearable computing device, an embedded computing device, or any other type of computing device.

The user computing device 102 includes one or more processors 112 and a memory 114. The one or more processors 112 can be any suitable processing device (e.g., a processor core, a microprocessor, an ASIC, a FPGA, a controller, a microcontroller, etc.) and can be one processor or a plurality of processors that are operatively connected. The memory 114 can include one or more non-transitory computer-readable storage mediums, such as RAM, ROM, EEPROM, EPROM, flash memory devices, magnetic disks, etc., and combinations thereof. The memory 114 can store data 116 and instructions 118 which are executed by the processor 112 to cause the user computing device 102 to perform operations. In some implementations, the data 116 can include datapoints included in a dataset and/or quantized elements that respectively correspond to the datapoints.

In some implementations, the user computing device 102 can store or include one or more machine-learned models 120. For example, the machine-learned models 120 can be or can otherwise include various machine-learned models such as neural networks (e.g., deep neural networks) or other types of machine-learned models, including non-linear models and/or linear models. Neural networks can include feed-forward neural networks, recurrent neural networks (e.g., long short-term memory recurrent neural networks), convolutional neural networks or other forms of neural networks. In some implementations, the models 120 can be configured to quantize datapoints included in a dataset to generate quantized elements that respectively correspond to the datapoints included in the dataset. In other implementations, the models 120 can correspond to or include the quantized elements themselves. In yet further implementations, the models 120 can operate to search quantized elements relative to a query. For example, the models 120 can perform a MIPS technique to return results from the dataset that are relevant a particular query.

In some implementations, the one or more machine-learned models 120 can be received from the server computing system 130 over network 180, stored in the user computing device memory 114, and then used or otherwise implemented by the one or more processors 112. In some implementations, the user computing device 102 can implement multiple parallel instances of a single machine-learned model 120 (e.g., to perform parallel quantization across multiple instances).

Additionally or alternatively, one or more machine-learned models 140 can be included in or otherwise stored and implemented by the server computing system 130 that communicates with the user computing device 102 according to a client-server relationship. For example, the machine-learned models 140 can be implemented by the server computing system 140 as a portion of a web service (e.g., a query-dataset comparison service). Thus, one or more models 120 can be stored and implemented at the user computing device 102 and/or one or more models 140 can be stored and implemented at the server computing system 130.

The user computing device 102 can also include one or more user input components 122 that receives user input. For example, the user input component 122 can be a touch-sensitive component (e.g., a touch-sensitive display screen or a touch pad) that is sensitive to the touch of a user input object (e.g., a finger or a stylus). The touch-sensitive component can serve to implement a virtual keyboard. Other example user input components include a microphone, a traditional keyboard, or other means by which a user can provide user input.

The server computing system 130 includes one or more processors 132 and a memory 134. The one or more processors 132 can be any suitable processing device (e.g., a processor core, a microprocessor, an ASIC, a FPGA, a controller, a microcontroller, etc.) and can be one processor or a plurality of processors that are operatively connected. The memory 134 can include one or more non-transitory computer-readable storage mediums, such as RAM, ROM, EEPROM, EPROM, flash memory devices, magnetic disks, etc., and combinations thereof. The memory 134 can store data 136 and instructions 138 which are executed by the processor 132 to cause the server computing system 130 to perform operations. In some implementations, the data 136 can include datapoints included in a dataset and/or quantized elements that respectively correspond to the datapoints.

In some implementations, the server computing system 130 includes or is otherwise implemented by one or more server computing devices. In instances in which the server computing system 130 includes plural server computing devices, such server computing devices can operate according to sequential computing architectures, parallel computing architectures, or some combination thereof.

As described above, the server computing system 130 can store or otherwise include one or more machine-learned models 140. For example, the models 140 can be or can otherwise include various machine-learned models. Example machine-learned models include neural networks or other multi-layer non-linear models. Example neural networks include feed forward neural networks, deep neural networks, recurrent neural networks, and convolutional neural networks. In some implementations, the models 120 can be configured to quantize datapoints included in a dataset to generate quantized elements that respectively correspond to the datapoints included in the dataset. In other implementations, the models 120 can correspond to or include the quantized elements themselves. In yet further implementations, the models 120 can operate to search quantized elements relative to a query. For example, the models 120 can perform a MIPS technique to return results from the dataset that are relevant a particular query.

The user computing device 102 and/or the server computing system 130 can train the models 120 and/or 140 via interaction with the training computing system 150 that is communicatively coupled over the network 180. The training computing system 150 can be separate from the server computing system 130 or can be a portion of the server computing system 130.

The training computing system 150 includes one or more processors 152 and a memory 154. The one or more processors 152 can be any suitable processing device (e.g., a processor core, a microprocessor, an ASIC, a FPGA, a controller, a microcontroller, etc.) and can be one processor or a plurality of processors that are operatively connected. The memory 154 can include one or more non-transitory computer-readable storage mediums, such as RAM, ROM, EEPROM, EPROM, flash memory devices, magnetic disks, etc., and combinations thereof. The memory 154 can store data 156 and instructions 158 which are executed by the processor 152 to cause the training computing system 150 to perform operations. In some implementations, the training computing system 150 includes or is otherwise implemented by one or more server computing devices.

The training computing system 150 can include a model trainer 160 that trains the machine-learned models 120 and/or 140 stored at the user computing device 102 and/or the server computing system 130 using various training or learning techniques, such as, for example, backwards propagation of errors. Gradient descent techniques can be used to iteratively update the parameters over a number of training iterations. For example, a loss function can be backpropagated through the model(s) to update one or more parameters of the model(s) (e.g., based on a gradient of the loss function). Various loss functions can be used such as mean squared error, likelihood loss, cross entropy loss, hinge loss, and/or various other loss functions. In some implementations, a loss function as proposed herein may be used to update one or more parameters of the model(s).

In some implementations, performing backwards propagation of errors can include performing truncated backpropagation through time. The model trainer 160 can perform a number of generalization techniques (e.g., weight decays, dropouts, etc.) to improve the generalization capability of the models being trained.

In particular, the model trainer 160 can train the machine-learned models 120 and/or 140 based on a set of training data 162. The training data 162 can include, for example, training examples which contain a plurality of ground-truth datapoints corresponding to top-ranking pairs of queries and data elements to learn a loss function which prioritizes the accuracy of estimations for top-ranking pairs. For example, in some implementations, the plurality of ground-truth datapoints can correspond to a plurality of embeddings that are continuous numerical feature representations included in an embedding dimensional space (e.g., embeddings output by a machine-learned embedding model).

In some implementations, if the user has provided consent, the training examples can be provided by the user computing device 102. Thus, in such implementations, the model 120 provided to the user computing device 102 can be trained by the training computing system 150 on user-specific data received from the user computing device 102. In some instances, this process can be referred to as personalizing the model.

The model trainer 160 includes computer logic utilized to provide desired functionality. The model trainer 160 can be implemented in hardware, firmware, and/or software controlling a general purpose processor. For example, in some implementations, the model trainer 160 includes program files stored on a storage device, loaded into a memory and executed by one or more processors. In other implementations, the model trainer 160 includes one or more sets of computer-executable instructions that are stored in a tangible computer-readable storage medium such as RAM hard disk or optical or magnetic media.

In some implementations, one or more of the machine-learned models 120 and 140 may include parameter values quantized according to the present disclosure. For example, model inputs, weights, activations, scale factors, biases, accumulators, outputs, and/or other parameter values used in a model may be quantized according to the present disclosure. In some examples, a parameter value is quantized with respect to a quantization error which is weighted with a weight value that positively correlates to the influence of the particular parameter value on the final output (e.g., the error is weighted with a weight value correlated to a magnitude of the parameter value). In some implementations, the output of a machine-learned model may include embeddings which are quantized according to the present disclosure. Such quantization may advantageously improve the speed of a similarity search (e.g., MIPS) across the generated embeddings against a later-submitted search query.

The network 180 can be any type of communications network, such as a local area network (e.g., intranet), wide area network (e.g., Internet), or some combination thereof and can include any number of wired or wireless links. In general, communication over the network 180 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

FIG. 1A illustrates one example computing system that can be used to implement the present disclosure. Other computing systems can be used as well. For example, in some implementations, the user computing device 102 can include the model trainer 160 and the training dataset 162. In such implementations, the models 120 can be both trained and used locally at the user computing device 102. In some of such implementations, the user computing device 102 can implement the model trainer 160 to personalize the models 120 based on user-specific data.

Figure 1B:
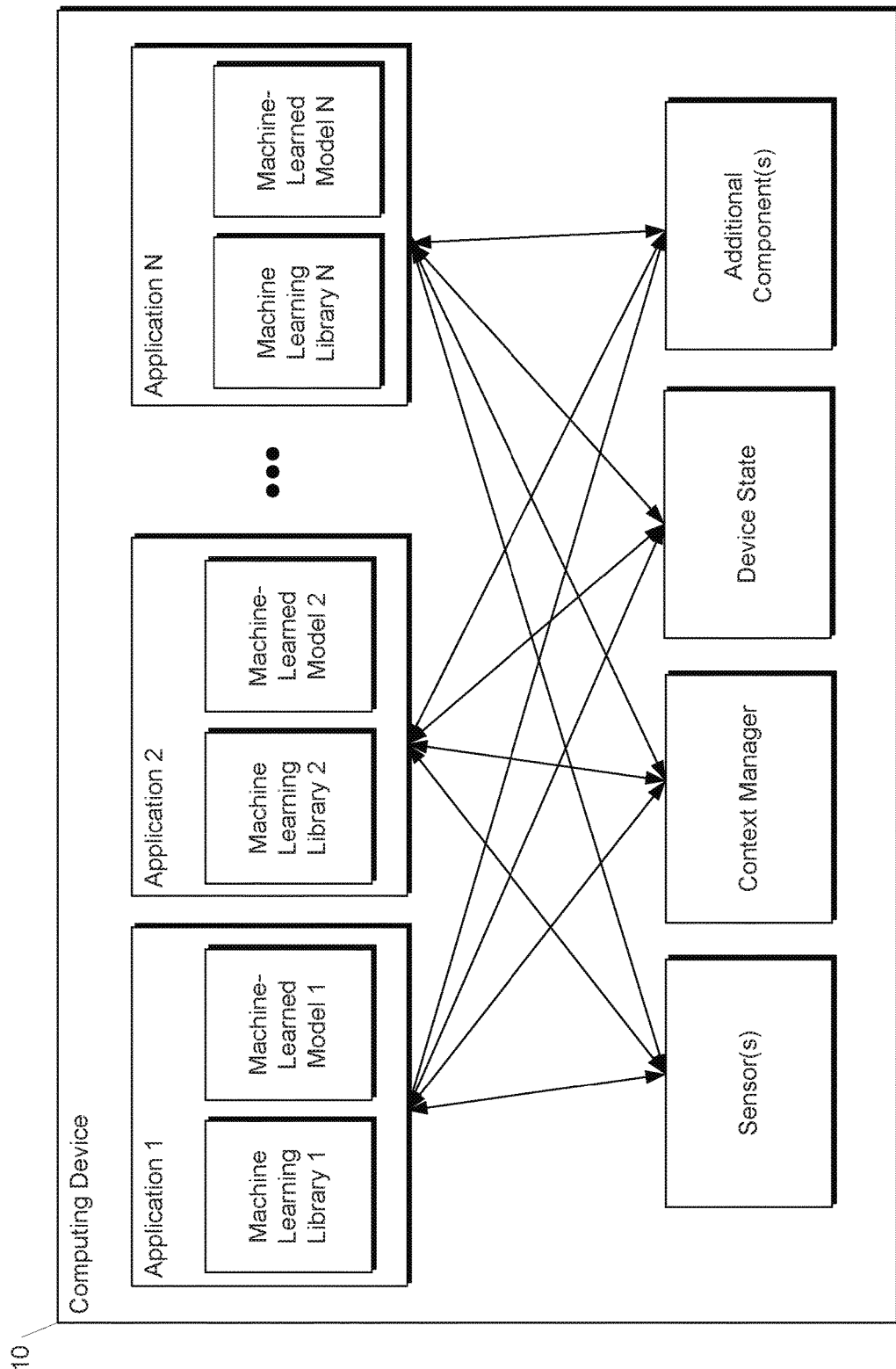
FIG. 1B depicts a block diagram of an example computing device according to example embodiments of the present disclosure.

FIG. 1B depicts a block diagram of an example computing device 10 that performs according to example embodiments of the present disclosure. The computing device 10 can be a user computing device or a server computing device.

The computing device 10 includes a number of applications (e.g., applications 1 through N). Each application contains its own machine learning library and machine-learned model(s). For example, each application can include a machine-learned model. Example applications include a text messaging application, an email application, a dictation application, a virtual keyboard application, a browser application, etc.

As illustrated in FIG. 1B, each application can communicate with a number of other components of the computing device, such as, for example, one or more sensors, a context manager, a device state component, and/or additional components. In some implementations, each application can communicate with each device component using an API (e.g., a public API). In some implementations, the API used by each application is specific to that application.

Figure 1C:
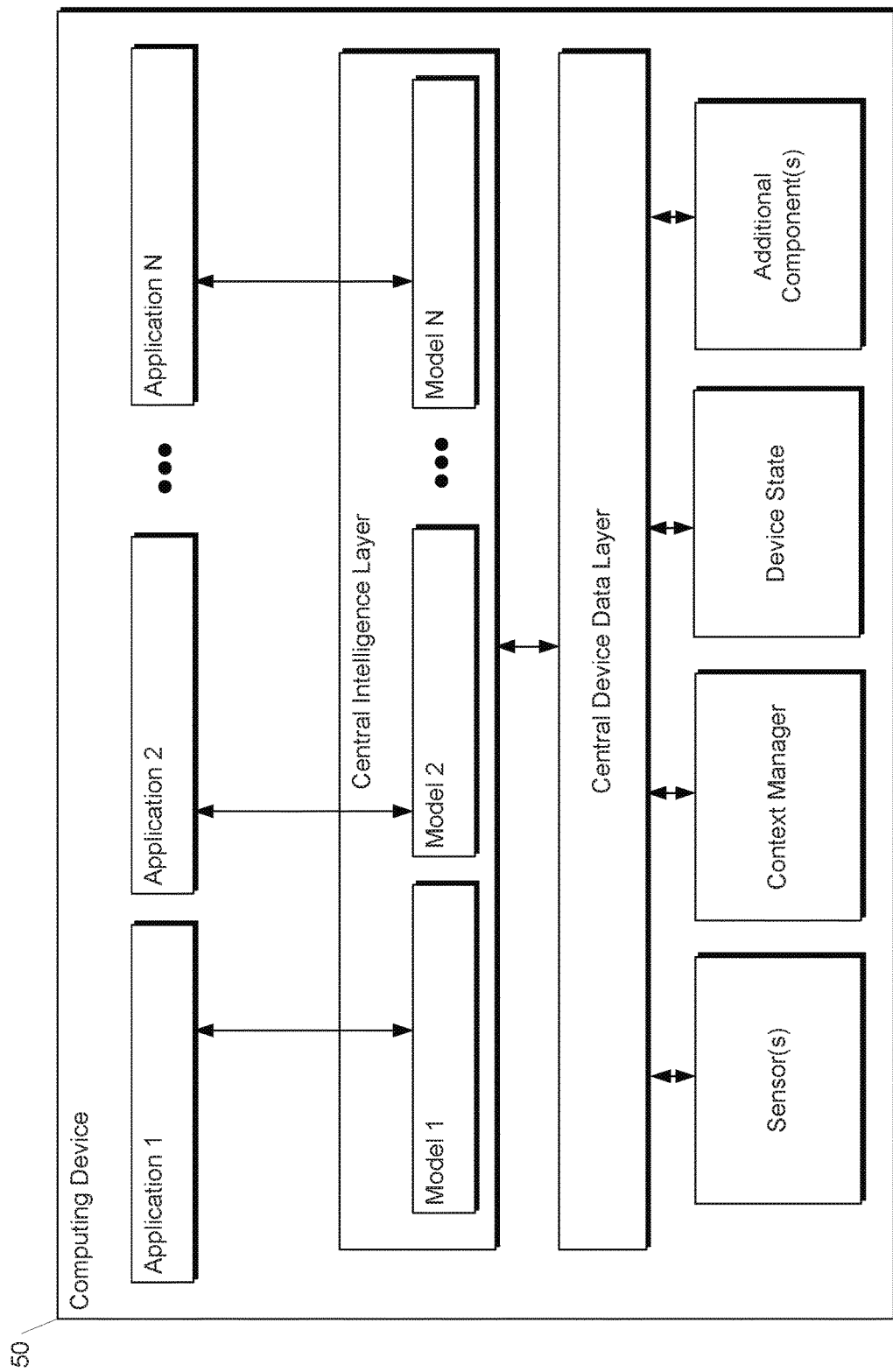
FIG. 1C depicts a block diagram of an example computing device according to example embodiments of the present disclosure.

FIG. 1C depicts a block diagram of an example computing device 50 that performs according to example embodiments of the present disclosure. The computing device 50 can be a user computing device or a server computing device.

The computing device 50 includes a number of applications (e.g., applications 1 through N). Each application is in communication with a central intelligence layer. Example applications include a text messaging application, an email application, a dictation application, a virtual keyboard application, a browser application, etc. In some implementations, each application can communicate with the central intelligence layer (and model(s) stored therein) using an API (e.g., a common API across all applications).

The central intelligence layer includes a number of machine-learned models. For example, as illustrated in FIG. 1C, a respective machine-learned model (e.g., a model) can be provided for each application and managed by the central intelligence layer. In other implementations, two or more applications can share a single machine-learned model. For example, in some implementations, the central intelligence layer can provide a single model (e.g., a single model) for all of the applications. In some implementations, the central intelligence layer is included within or otherwise implemented by an operating system of the computing device 50.

The central intelligence layer can communicate with a central device data layer. The central device data layer can be a centralized repository of data for the computing device 50. As illustrated in FIG. 1C, the central device data layer can communicate with a number of other components of the computing device, such as, for example, one or more sensors, a context manager, a device state component, and/or additional components. In some implementations, the central device data layer can communicate with each device component using an API (e.g., a private API).

Example Methods

Figure 2:
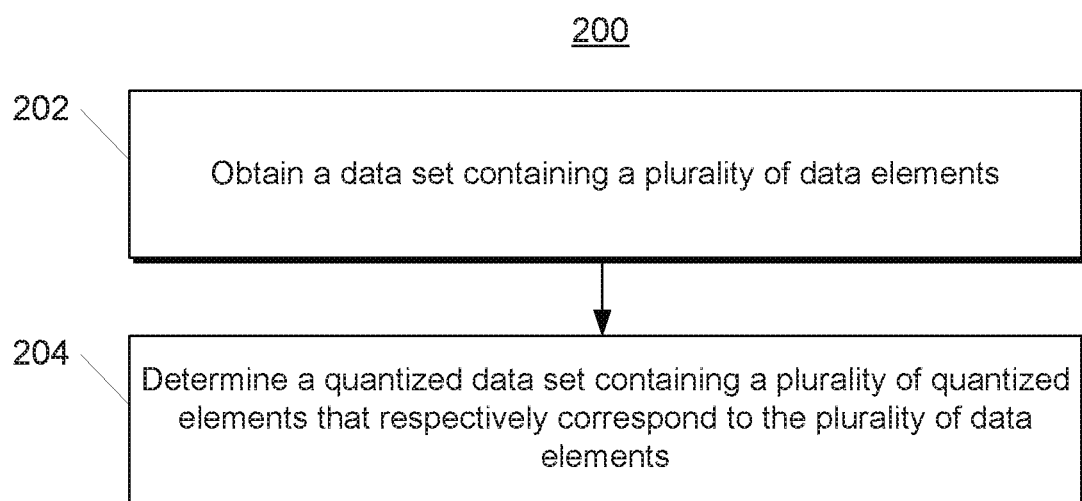
FIG. 2 depicts a flow chart diagram of an example method to perform quantization according to example embodiments of the present disclosure.
Figure 3:
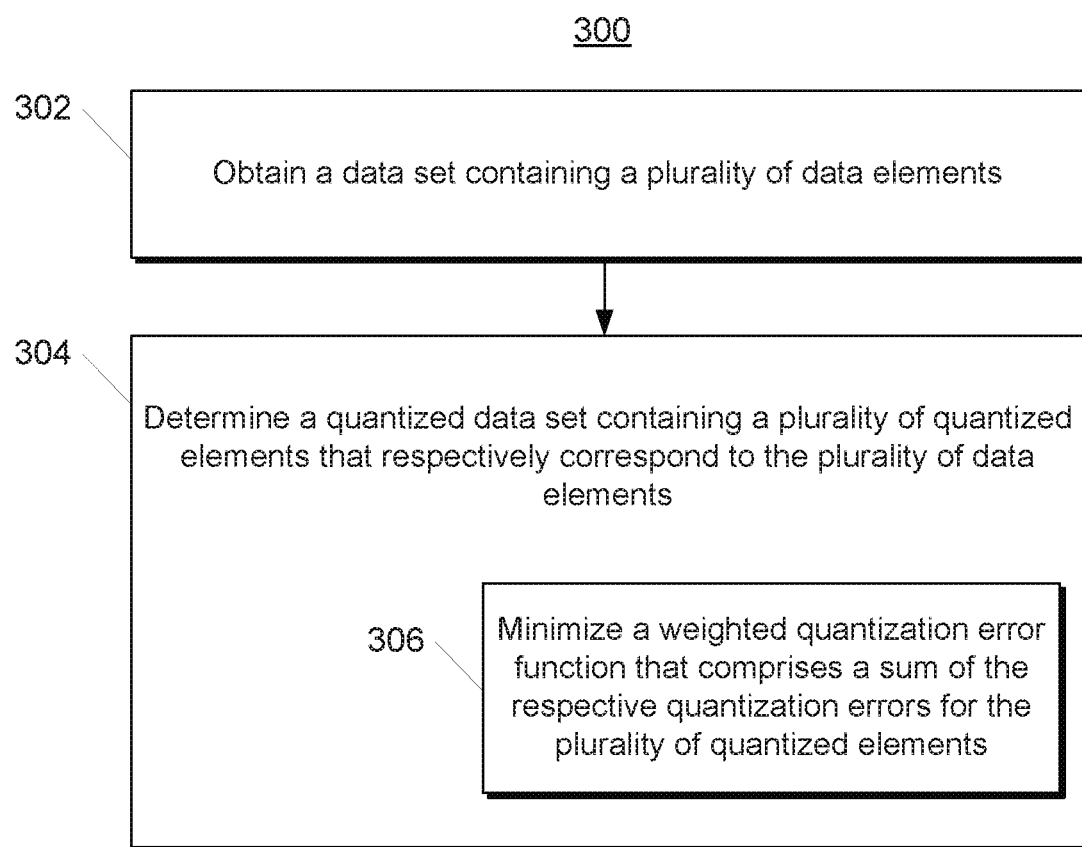
FIG. 3 depicts a flow chart diagram of an example method to perform quantization according to example embodiments of the present disclosure.
Figure 4:
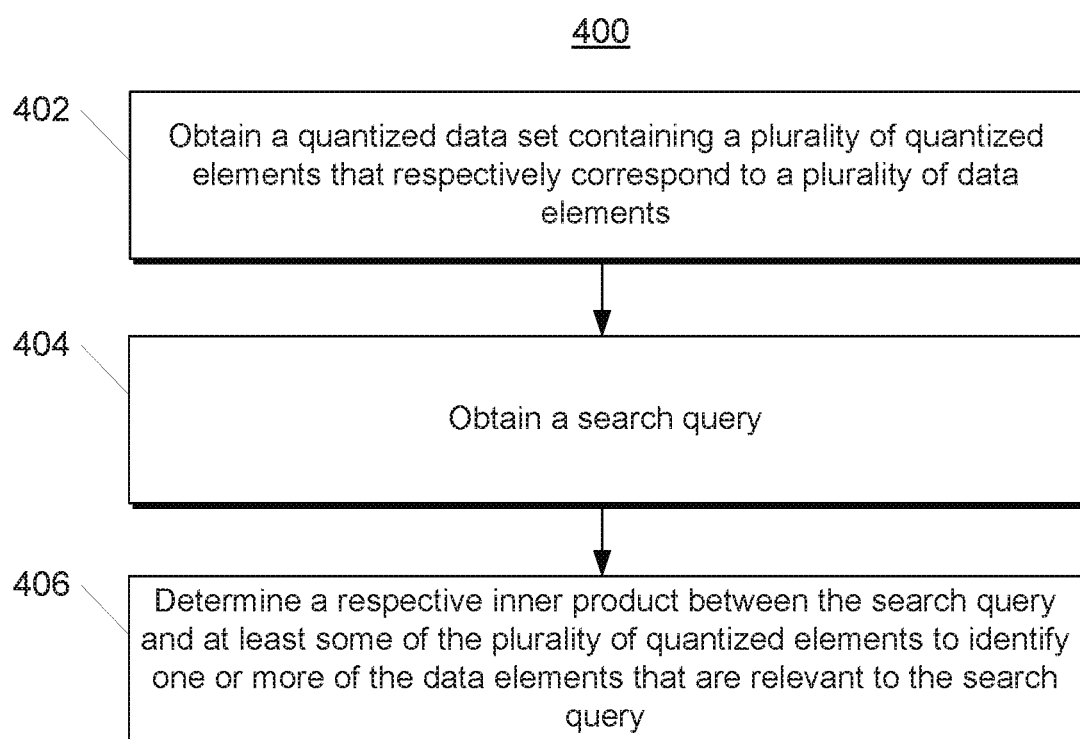
FIG. 4 depicts a flow chart diagram of an example method to perform a search over a dataset quantized according to example embodiments of the present disclosure.

In general, FIGS. 2-4 depict flow chart diagrams of example methods to perform according to example embodiments of the present disclosure. In some implementations, the methods may be performed by one or more computing devices and/or systems. Although a figure depicts steps performed in a particular order for purposes of illustration and discussion, the methods of the present disclosure are not limited to the particularly illustrated order or arrangement. The various steps of the methods can generally be omitted, rearranged, combined, and/or adapted in various ways without deviating from the scope of the present disclosure.

Referring now to FIG. 2, step 202 of method 200 includes obtaining a dataset containing a plurality of data elements. The dataset may be obtained in any applicable manner, optionally being obtained directly from the output of another system or method or retrieved from a storage medium. The data elements may, in some implementations, include vectors, although the vectors may, in some implementations, form subvectors of a set of larger vectors and/or be collected within a subspace of a space containing a set of the larger vectors.

Step 204 of method 200 further includes determining a quantized dataset containing a plurality of quantized elements that respectively correspond to the plurality of data elements. The quantized element respectively corresponding to a data element (or a plurality of data elements) may be determined to approximate the data element(s) and/or to approximate a calculation performed with the data element(s). For instance, the quantized element may be determined to reduce the approximation error of an approximate inner product between a query and the quantized element as compared to a true inner product between the query and the data element. The approximation error (or an expected value thereof) may be weighted with a weight value positively correlated to the magnitude of the true inner product. In some implementations, the quantized element corresponds to and represents a plurality of data elements (or subdivisions thereof), and the data element among the plurality of data elements for which the inner product with the query is best approximated (e.g., has the lowest relative error) is the data element among the plurality of data elements which produces (or is expected to produce) the largest magnitude inner product with the query. Relative error may include, in some examples, the magnitude of the difference between the approximation and the actual value divided by the magnitude of the actual value.

In some implementations, the quantized dataset may be determined by an algorithm. In some implementations, the quantized dataset may be determined by a machine-learned model in which the model has learned a loss function corresponding to quantization error as disclosed herein. In some implementations, the quantized dataset may be determined by an algorithm which seeks to reduce the quantization error of the quantized dataset.

Referring now to FIG. 3, steps 302 and 304 of method 300 generally correspond to steps 202 and 204 of method 200, except that step 304 of method 300 include a substep of minimizing a weighted quantization error function that comprises a sum of the respective quantization errors for the plurality of quantized elements. As used herein, to minimize a quantity may include finding a local or global minimum of the quantity and may alternatively or additionally include the reduction of the quantity, such as the reduction of the quantity to within a target cutoff or convergence criterion (e.g., minimization of a quantity may include reducing the quantity to within a threshold amount (e.g., 5%, 1%, etc.) away from the local or global minimum).

In some implementations, the quantization error to be minimized may be calculated over the population of the plurality of quantized elements or may additionally or alternatively be calculated over a subset of the plurality of quantized elements. For example, a quantization error as disclosed herein may be applied in a vector quantization approach, a product quantization approach, binary quantization approach, or other quantization approaches.

Referring now to FIG. 4, step 402 of method 400 includes obtaining a quantized dataset containing a plurality of quantized elements that respectively correspond to a plurality of data elements. The plurality of quantized elements may be obtained from a storage medium, from a user input, and/or from the output of an upstream system, such as a system or device which generated the quantized dataset according to methods of the present disclosure. In some implementations, the quantized dataset of step 402 is generated by a method 200 or method 300.

Step 404 of method 400 includes obtaining a search query. The search query may be any value or set of values submitted for comparison to the data elements. For instance, in some implementations, it is desired to find one or more data elements which are similar to the search query. The search query may be compared with the quantized elements to approximate a comparison with the data elements. In some implementations, inner products are calculated between the search query and the quantized elements to approximate the inner products with the data elements.

Step 406 of method 400 includes determining a respective inner product between the search query and at least some of the plurality of quantized elements to identify one or more of the data elements that are relevant to the search query. For example, step 406 of method 400 can include determining a respective inner product between the search query and each of a number of codebook entries to identify one or more codebook entries that are most relevant to the search query. After identifying the one or more codebook entries, the method 400 can include determining a respective inner product between the search query and at least some of a plurality of data elements that are assigned to the one or more codebook entries to identify the one or more of the data elements that are relevant to the search query In some implementations, the magnitude of the inner product is considered representative of the similarity of the pairing being compared and, thus, the relevance of a particular corresponding data element to the search query.

In some implementations, the quantization and search methods disclosed herein may further include pruning operations, including pruning operations to reduce the number of points to be quantized, the number of quantized points to be searched, or both. Additionally, or alternatively, tree and/or graph search methods may be used in combination with the quantization and search methods disclosed herein. For example, in some implementations, the search may be restricted to consider only datapoints included in certain node(s) of a tree.

ADDITIONAL DISCLOSURE

The technology discussed herein makes reference to servers, databases, software applications, and other computer-based systems, as well as actions taken and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

One example aspect is directed to a computing system comprising: one or more processors; and one or more non-transitory computer-readable media that collectively store: a quantized dataset comprising a plurality of quantized elements that respectively correspond to a plurality of data elements, the plurality of quantized elements having been selected based at least in part on a loss function that comprises a sum of respective quantization errors respectively associated with the plurality of quantized elements, wherein the respective quantization error for each quantized element is weighted by a respective weight value having a weight magnitude that is positively correlated with a magnitude of an inner product between the corresponding data element and a query; and instructions that, when executed by the one or more processors, cause the computing system to perform operations, the operations comprising: obtaining a new query; determining a respective inner product between the new query and at least some of the plurality of quantized elements to identify one or more of the data elements that are relevant to the new query.

The operations can further comprise: pruning the quantized dataset such that the at least some of the plurality of quantized elements is a subset of the plurality of quantized elements.

The operations can further comprise: determining a largest respective inner product magnitude among the respective inner products between the new query and the at least some of the plurality of quantized elements by conducting a tree or graph search.

The respective quantization error associated with each quantized element can comprise: a parallel component that is parallel to the corresponding data element; and an orthogonal component that is orthogonal to corresponding data element; wherein the quantization error includes a weighted sum of the parallel component and the orthogonal component, the parallel component being weighted by the weight value.

The inner product between the corresponding data element and the query can comprise an expected inner product between the corresponding data element and the query.

The query can be uniformly distributed in a d-dimensional unit sphere.

The weight value for each quantized element can be determined according to a weight function that is a function of the inner product between the corresponding data element for such quantized element and the query.

The weight function can comprise a function that evaluates whether the inner product is greater than a threshold value. The function can be a step function.

The weight function can be a monotonically increasing function of the magnitude of the inner product.

The weight function can comprise a function that outputs a weight determined by the magnitude of the inner product and a threshold value. The threshold value can comprises a user-specified value.

The weight value for each quantized element can be based at least in part on a user-specified hyperparameter.

The weight value for each quantized element can be determined according to a weight function that is analytically computable.

The plurality of quantized elements can be selected based at least in part by vector quantization, wherein the loss function was minimized across the plurality of data elements.

The plurality of quantized elements can be selected based at least in part by product quantization, wherein the loss function was minimized across a plurality of subspaces, each of the plurality of subspaces comprising a subset of one of the plurality of data elements.

What is claimed is:

1. A computer-implemented method, the method comprising:
    obtaining, by one or more computing devices, a dataset containing a plurality of data elements;
    compressing, by the one or more computing devices, the dataset into a quantized dataset that has a reduced memory size, wherein compressing, by the one or more computing devices, the data into the quantized dataset comprises determining, by the one or more computing devices, a plurality of quantized elements of the quantized dataset that respectively correspond to the plurality of data elements of the dataset;
    assigning, to a respective quantization error associated with each of the plurality of quantized elements, a respective weight value having a weight magnitude that is positively correlated with a magnitude of an inner product between the corresponding data element for such quantized element and a search query; and
    processing one or more tasks associated with the search query based on the quantized dataset and the respective weight value assigned to the respective quantization error associated with each of the plurality of quantized elements.

2. The computer-implemented method of claim 1, wherein the respective quantization error for each quantized element comprises:
    a parallel component that is parallel to the corresponding data element; and
    an orthogonal component that is orthogonal to the corresponding data element;
    wherein the respective quantization error includes a weighted sum of the parallel component and the orthogonal component, the parallel component being weighted by the respective weight value.

3. The computer-implemented method of claim 1, wherein the inner product between the corresponding data element and the search query comprises an expected inner product between the corresponding data element and the search query.

4. The computer-implemented method of claim 3, wherein the search query is uniformly distributed in a d-dimensional unit sphere.

5. The computer-implemented method of claim 1, wherein the weight value for each quantized element is determined according to a weight function that is a function of the inner product between the corresponding data element for such quantized element and the search query.

6. The computer-implemented method of claim 5, wherein the weight function comprises a function that outputs a weight determined by the magnitude of the inner product and a threshold value.

7. The computer-implemented method of claim 5, wherein:
    the weight function is a monotonically increasing function of the magnitude of the inner product.

8. The computer-implemented method of claim 6, wherein the threshold value comprises a user-specified value.

9. The computer-implemented method of claim 1, wherein determining, by the one or more computing devices, the plurality of quantized elements comprises:
    minimizing, by the one or more computing devices, a weighted quantization error function that comprises a sum of the respective quantization errors for the plurality of quantized elements.

10. The computer-implemented method of claim 1, wherein each quantized element is characterized by a relative error, the relative error for each quantized element being defined with respect to the corresponding data element and being inversely correlated to the expected inner product between the search query and the corresponding data element.

11. The computer-implemented method of claim 1, wherein the weight value for each quantized element is based at least in part on a user-specified hyperparameter.

12. The computer-implemented method of claim 1, wherein the weight value for each quantized element is determined according to a weight function that is analytically computable.

13. The computer-implemented method of claim 1, wherein determining, by the one or more computing devices, the plurality of quantized elements comprises:
performing, by the one or more computing devices, vector quantization with a loss function that comprises a sum of the respective quantization errors for the plurality of quantized elements.

14. The computer-implemented method of claim 1, wherein determining, by the one or more computing devices, the plurality of quantized elements comprises:
performing, by the one or more computing devices, product quantization with a loss function that comprises a sum of the respective quantization errors for the plurality of quantized elements for each of a plurality of subspaces.

15. The computer-implemented method of claim 1, further comprising, after determining plurality of quantized elements:
obtaining, by the one or more computing devices, a new search query;
determining, by the one or more computing devices, a respective inner product between the new search query and at least some of the plurality of quantized elements to identify one or more of the data elements that are relevant to the new search query.

16. The computer-implemented method of claim 15, further comprising:
pruning, by the one or more computing devices, the quantized dataset such that the at least some of the plurality of quantized elements is a subset of the plurality of quantized elements.

17. The computer-implemented method of claim 15, further comprising:
determining, by the one or more computing devices, a largest respective inner product magnitude among the respective inner products between the new search query and the at least some of the plurality of quantized elements by conducting a tree or graph search.

18. A computing system comprising
one or more processors; and
one or more non-transitory computer-readable media that collectively store:
a quantized dataset comprising a plurality of quantized elements that respectively correspond to a plurality of data elements, the plurality of quantized elements having been selected based at least in part on a loss function that comprises a sum of respective quantization errors respectively associated with the plurality of quantized elements; and
instructions that, when executed by the one or more processors, cause the computing system to perform operations, the operations comprising assigning, to a respective quantization error associated with each of the plurality of quantized elements, a respective weight value having a weight magnitude that is positively correlated with a magnitude of an inner product between the corresponding data element for such quantized element and a search query;
obtaining a new search query;
determining a respective inner product between the new search query and at least some of the plurality of quantized elements based on the respective weight value assigned to the respective quantization error associated with each of the plurality of quantized elements to identify one or more of the data elements that are relevant to the new search query; and
processing one or more tasks associated with the new search query based on the one or more of the data elements that are relevant to the new search query.

19. The computing system of claim 18, wherein the operations further comprise:
pruning the quantized dataset such that the at least some of the plurality of quantized elements is a subset of the plurality of quantized elements.

20. A computing system, comprising:
one or more processors; and
one or more non-transitory computer-readable media that collectively store instructions that, when executed by one or more computing devices, cause the one or more computing devices to perform operations, the operations comprising:
obtaining a dataset containing a plurality of data elements;
determining a quantized dataset containing a plurality of quantized elements that respectively correspond to the plurality of data elements, each of the plurality of quantized elements having a quantization error;
minimizing a sum of the quantization error of each of the plurality of data elements;
wherein the quantization error increases in magnitude with an expected value of a weighted difference between a true inner product and an approximate inner product, the true inner product being an inner product between a search query and one of the plurality of data elements, and the approximate inner product being an inner product between the search query and one of the plurality of quantized elements respectively corresponding to the one of the plurality of data elements;
assigning, to a respective quantization error associated with each of the plurality of quantized elements, a respective weight value having a weight magnitude that positively correlated to the magnitude of the true inner product; and
processing one or more tasks associated with the search query based on the quantized dataset and the respective weight value assigned to the respective quantization error associated with each of the plurality of quantized elements.

* * * * *